(12) United States Patent
Mayer et al.

(10) Patent No.: US 7,180,344 B2
(45) Date of Patent: Feb. 20, 2007

(54) PHASE LOCKED LOOP AND METHOD FOR TRIMMING A LOOP FILTER

(75) Inventors: Thomas Mayer, Linz (AT); Werner Schelmbauer, Linz (AT); Günter Märzinger, Ulrichsberg (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/211,773

(22) Filed: Aug. 25, 2005

(65) Prior Publication Data

US 2006/0076990 A1  Apr. 13, 2006

(30) Foreign Application Priority Data

Aug. 27, 2004  (DE) .................... 10 2004 041 656

(51) Int. Cl.
*H03L 7/06* (2006.01)
(52) U.S. Cl. ....................................... 327/156; 327/148
(58) Field of Classification Search ................ None
See application file for complete search history.

(56) References Cited

U.S. PATENT DOCUMENTS

| | | | | | |
|---|---|---|---|---|---|
| 4,829,258 | A | * | 5/1989 | Volk et al. | 327/156 |
| 4,908,841 | A | * | 3/1990 | Leis et al. | 375/327 |
| 5,056,118 | A | * | 10/1991 | Sun | 375/342 |
| 5,384,502 | A | * | 1/1995 | Volk | 327/157 |
| 5,694,088 | A | * | 12/1997 | Dickson | 331/12 |
| 5,877,657 | A | * | 3/1999 | Yoshinaka | 331/16 |
| 6,731,145 | B1 | | 5/2004 | Humphreys et al. | |
| 7,084,709 | B1 | * | 8/2006 | Leong et al. | 331/11 |
| 7,095,287 | B2 | * | 8/2006 | Maxim et al. | 331/44 |
| 2002/0080901 | A1 | | 6/2002 | Ham, III | |
| 2002/0196060 | A1 | * | 12/2002 | Ichimaru | 327/156 |
| 2003/0190005 | A1 | * | 10/2003 | Amick et al. | 375/376 |
| 2003/0214330 | A1 | * | 11/2003 | Tanigashira et al. | 327/156 |
| 2004/0036539 | A1 | * | 2/2004 | Hammes et al. | 331/16 |
| 2005/0046452 | A1 | * | 3/2005 | Briones | 327/156 |

FOREIGN PATENT DOCUMENTS

WO    WO 03/100979    12/2003

OTHER PUBLICATIONS

"Phase-Locked Loops for High-Frequency Receivers and Transmitters-Part 2", Mike Curtin, and Paul O'Brien, Analog Dialogue 33-5, Analog Devices 1999, pp. 1-5.
"Advanced Electronic Circuits" U. Tietze and Ch. Schenk, Based on Halbleiter-Schaltungstechnik, U. Tietze and Ch. Schenk, Springer, 1978, 4 pgs.

* cited by examiner

*Primary Examiner*—Timothy P. Callahan
*Assistant Examiner*—Cassandra Cox
(74) *Attorney, Agent, or Firm*—Eschweiler & Associates, LLC

(57) ABSTRACT

The invention includes a phase locked loop which has a voltage-controlled oscillator, a phase comparator and a charge pump. The charge pump is coupled to a setting input of the voltage-controlled oscillator via a loop filter. A feedback input of the phase comparator is connected to the output of the voltage-controlled oscillator via a frequency divider, and the phase comparator is designed to output an actuating signal to the charge pump. The loop filter has a first charge store and at least one tunable element that alters a filter characteristic of the loop filter. In addition, there is a trimming circuit which is coupled to the at least one further element in order to alter the filter characteristic of the loop filter and which is designed to compare a time period for a charging operation in a loop filter with a reference time period.

22 Claims, 3 Drawing Sheets

PHASE LOCKED LOOP AND METHOD FOR TRIMMING A LOOP FILTER

REFERENCE TO RELATED APPLICATIONS

This application claims the benefit of the priority date of German application DE 10 2004 041 656.7, filed on Aug. 27, 2004, the contents of which are herein incorporated by reference in their entirety.

FIELD OF THE INVENTION

The invention relates to a phase locked loop, and a method for trimming a loop filter for a phase locked loop.

BACKGROUND OF THE INVENTION

Phase locked loops, particularly for mobile radio applications, are important components of large-scale integrated circuits. Such phase locked loops for providing stable-frequency signals are known, by way of example, from Tietze/Schenk: "Halbleiterschaltungstechnik" [Semiconductor Circuitry], pp. 1155–1156, 12$^{th}$ Edition, Springer 2002 and Mike Curtin et. al. "Phase-locked Loops for High-Frequency Receivers and Transmitter—Part 2", Analog Dialogue 33–5, Analog Devices 1999.

When implementing large-scale integrated circuits, the problem of very large tolerances in the component parts of the individual switching elements frequently arises. These are in some cases process-related and are extremely difficult to calculate in advance during a development or design phase. It is therefore usual to take into account the parameter discrepancies in the components in integrated circuits during an actual development phase and to plan on an over dimensioned scale if appropriate.

In mobile radio applications, phase locked loops are used to provide an oscillator signal. These phase locked loops are used to actuate a voltage-controlled oscillator, with the control signal being supplied to the setting input of the voltage-controlled oscillator via a filter. In phase locked loops, this filter is often a determining variable for the dynamic response of the whole control loop. It is therefore of great importance to ensure a particular and easily calculatable filter characteristic. Discrepancies from an ideal filter characteristic on account of component fluctuations need to be restricted as far as possible in the circuitry.

Besides the possibility of compensating for the aforementioned component tolerances in the development phase of the phase locked loop by means of appropriate over dimensioning features, another option is to trim particularly the RC elements which determine the filter characteristic. In this context, these elements are often arranged outside of the circuit in order to allow trimming in a later production step too. However, this results in an additional space requirement which conflicts with the demand for miniaturization and large-scale integrated circuits.

Trimming is sometimes carried out using an internal reference element. The reference may likewise be in the form of a large-scale integrated circuit. However, this also requires additional space, since particularly the capacitors which contain the RC element take up a relatively large surface area in semiconductor processes today. Furthermore, additional current and voltage sources are required for operating the reference element.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a phase locked loop which is easy to integrate and additionally allows trimming to compensate for component tolerances using simple means. The invention is also directed to a method for trimming a loop filter for a phase locked loop which can be carried out with little complexity.

In one embodiment of the invention, a phase locked loop comprises a voltage-controlled oscillator, a phase comparator and a charge pump. A feedback input of the phase comparator is connected to the control loop output via a frequency divider to form a feedback path. The input of the charge pump is connected to the phase comparator and the output of the charge pump is coupled to a setting input of the voltage-controlled oscillator via a loop filter. The charge pump is designed to output a control voltage from the actuating signals. In accordance with the invention, the loop filter in this arrangement comprises a first charge store and at least one tunable element which is designed to alter a filter characteristic of the loop filter. Tuning the tunable element of the loop filter therefore changes the filter characteristic of the loop filter. In addition, there is a trimming circuit which is coupled to the at least one further element of the loop filter which is configured to compare a time period for a charging operation in the loop filter with a reference time period. It is thus configured to compare the charging time of the first charge store in the loop filter with the reference time.

The inventive circuit therefore measures the loop filter characteristic using the charge pump. As a result, it is advantageously possible to save an additional reference element and an additional current source, and reduce the space requirement. In accordance with the invention, trimming is carried out by means of a measurement from the loop filter itself. Tolerances in the components of the loop filter can thus be equalized directly. An additional error which may arise on account of a less than ideal match between a reference element and the actual loop filter is likewise overcome.

The circuit of the present invention is particularly advantageous if all of the elements of the loop filter which determine the transfer characteristic have the same percentage discrepancy. In that case, it is expedient for the first charge store also to be configured with a tunable element. This makes it possible to tune all of the elements of the loop filter to the same extent and thus to keep a shape of the frequency response constant.

In one embodiment of the invention, the trimming circuit is configured to derive the charging time for the loop filter by comparing a voltage drop across the charge store in the loop filter with the reference voltage. Alternatively, the trimming circuit is coupled to the output of the loop filter in order to use a voltage which can be tapped off at the output for the comparison. The trimming circuit thus ascertains the charging time period by means of a voltage comparison and uses the at least one further element of the loop filter to alter the filter characteristics such that component-related variations are compensated for.

In one embodiment of the invention, the trimming circuit comprises a switchable reference charge pump for outputting a reference voltage or else comprises a reference voltage source. In this case, the reference charge pump is coupled to a first input of a comparator, whose other input is connected to an output of the loop filter.

Likewise in an embodiment of the invention, the at least one tunable element of the loop filter comprises at least one second charge store which is arranged in parallel with the first charge store and which can be switched by the trimming circuit. In one example the loop filter is configured to have a number of charge stores which are arranged in parallel and which can each be switched by a switch in parallel with the first charge store.

In another embodiment of the invention, the at least one tunable element of the loop filter is configured to include an RC element. The RC element comprises a tunable resistor and a second charge store, with a tuning connection of the resistor being connected to the trimming circuit. In these embodiments, the loop filter is configured to alter its filter characteristic by virtue of the time constant for a charging operation for RC elements or charge stores being variable. Such alteration of the time constant can be effected by connecting or disconnecting parallel-connected charge stores or altering the resistance which prescribes the charging current.

In one example the capacitances of the first and of the at least one second switchable charge store differ by a factor of two. This binary weighting of connectable capacitances makes it possible to minimize the discrepancy among the individual capacitances, since each individual capacitance can be produced by connecting the same basic capacitance in parallel. These capacitances may comprise capacitors.

In another embodiment of the invention, a second switch that can be controlled by the trimming circuit is provided. This switch is used to discharge the first charge store and the at least one second charge store. It is thus arranged between a first connection of the charge store and a reference potential and is designed to be able to be actuated by the trimming circuit.

In accordance with another embodiment of the invention, a method for trimming a loop filter, comprises providing a loop filter with at least one charge store, and supplying a charging current to the loop filter. The method further comprises ascertaining a time period for a charging operation in the charge store, and altering a filter characteristic on the basis of the ascertained time period.

Consequently, the inventive method involves the filter characteristic of the loop filter being gauged using the charging time for the loop filter itself. Component tolerances of a loop filter are thus ascertained, and the filter characteristic is altered on the basis of the charging time such that the fluctuations in the components of the loop filter are compensated for.

In one embodiment of the inventive method, ascertaining a charging time has provision for a reference voltage to be generated first. The voltage which is output at the output of the loop filter is then compared with the reference voltage R, and a signal is generated if the voltage which is output reaches or exceeds the reference voltage. The time which has elapsed since the start of the charging current supply up to detection of the signal denotes the charging time. This time is compared with the reference time and on the basis of the comparison the filter characteristic is altered.

As an alternative to the above ascertainment, another embodiment of the invention comprises comparing a voltage which is output at the output of the loop filter with the reference voltage. After a particular time, the comparison value is ascertained. Since this time is prescribed, the comparison result is dependent on the component-related tolerances of the loop filter, which prescribes the charging time and hence the voltage which is output at the output.

In one example, a time constant for the charging operation is increased if the charging time is shorter than the reference time or alternatively the voltage which is output at the output of the loop filter is lower than the reference voltage. On the other hand, one embodiment of the method involves the time constant for the charging operation being reduced if the charging time is longer than the reference time or alternatively the voltage which is output at the output of the loop filter is higher than the reference voltage.

In another embodiment of the inventive method, the filter characteristic is altered by connecting or disconnecting charge stores. These alter the charging time and hence the filter characteristic. Alternatively, the load which prescribes the charging current may also be altered.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed.

BRIEF DESCRIPTION OF THE DRAWINGS

The text below gives a detailed explanation of the invention using an exemplary embodiment with reference to the drawings, in which.

DETAILED DESCRIPTION OF THE INVENTION

Figure 1:
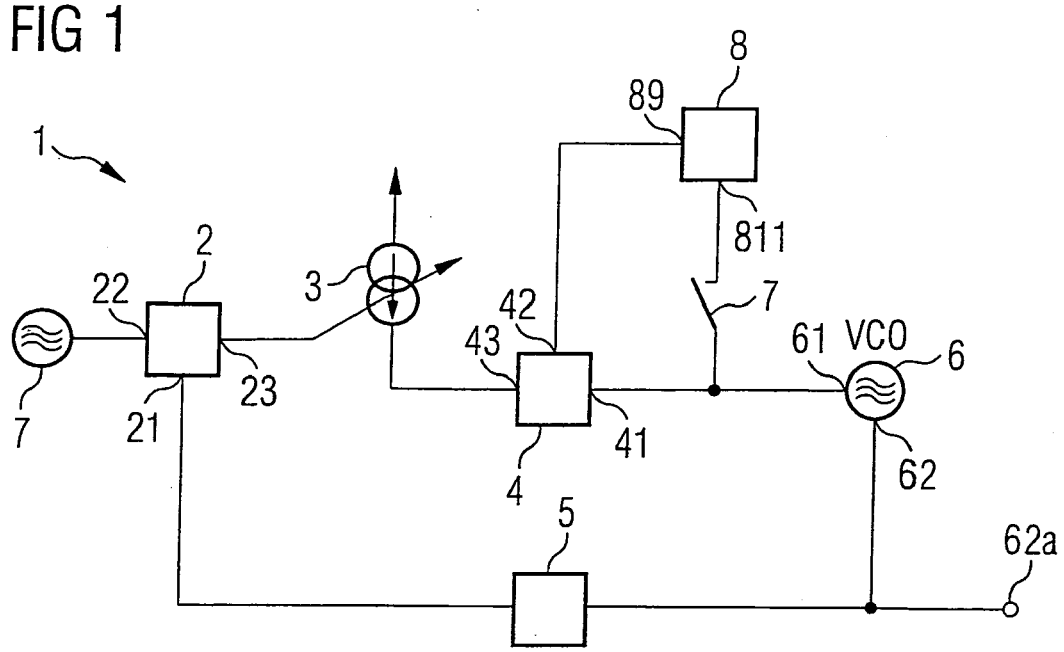
FIG. 1 is a combined block/schematic diagram illustrating an exemplary embodiment of the phase locked loop based on the invention.

FIG. 1 shows an inventive phase locked loop in accordance with one exemplary embodiment of the invention which, to trim it, ascertains the filter charging time and compares this with a reference time. The phase locked loop shown here may in one example be implemented as an integrated circuit in a semiconductor body. The control loop can be used in various applications, for example for mobile radio applications for providing a particularly stable-frequency local oscillator signal.

The inventive phase locked loop contains a voltage-controlled oscillator 6 having a setting input 61 and an output 62. The output 62 of the voltage-controlled oscillator 6 also forms the control output 62a at the same time. The setting input 61 is used to supply an actuating signal for tuning and hence setting the frequency of the output signal at the output 62.

In addition, the output 62 is coupled to a frequency divider 5 to form a feedback path. The frequency divider divides the frequency of the signal which is output by the voltage-controlled oscillator 6 and supplies a frequency-divided signal to a feedback input 21 of a phase detector 2.

The phase detector 2 which is also called the phase comparator, contains a second input, called reference input 22, to which a reference signal is supplied by a reference oscillator 7. The phase comparator 2 is designed to compare the two phases of the signals applied to the reference input 22 and to the feedback input 21. On the basis of the phase difference between the two signals, the phase detector 2 generates an actuating signal which it outputs at its output 23. The output is connected to a charge pump 3. Using this actuating signal, the charge pump 3 generates a control voltage which is supplied to the setting input 61 of the voltage-controlled oscillator 6 again via a loop filter 4.

The output 41 of the loop filter 4 is connected to the setting input 61 of the oscillator 6. In addition, a tap is provided which also couples the output 41 of the loop filter 4 to an input 811 of a trimming circuit 8 via a switch 7. In this case, the switch 7 is arranged such that the signal path between the output 41 and the setting input 61 is not broken, regardless of the switch position of the switch 7. The switch can thus be provided without any high demands on the quality. Alternatively, the switch 7 may also be arranged in the signal path and can couple the output 41 to the setting input 61 in a first operating state and can couple the output 41 to the input 811 in a second state.

In the present exemplary embodiment, the switch 7, in one operating state, couples the output 41 of the loop filter 4 to the input 811 of the trimming circuit 8. The trimming circuit 8 has a setting output 89 which is connected to a setting input 42 of the loop filter 4.

Component-related variations within the loop filter 4 cause a filter transfer characteristic of the loop filter 4 to change. By way of example, the cutoff frequency of the loop filter is increased or reduced. However, the transfer characteristic is a determining variable for the dynamic response of the phase locked loop. It is therefore necessary to determine said dynamic response by means of suitable measures in order to compensate for any discrepancies in this way and to maintain the desired high-frequency parameters for the output signal on the control loop. To this end, the trimming circuit 8 is provided, which is used for trimming the loop filter according to the present invention.

Figure 2:
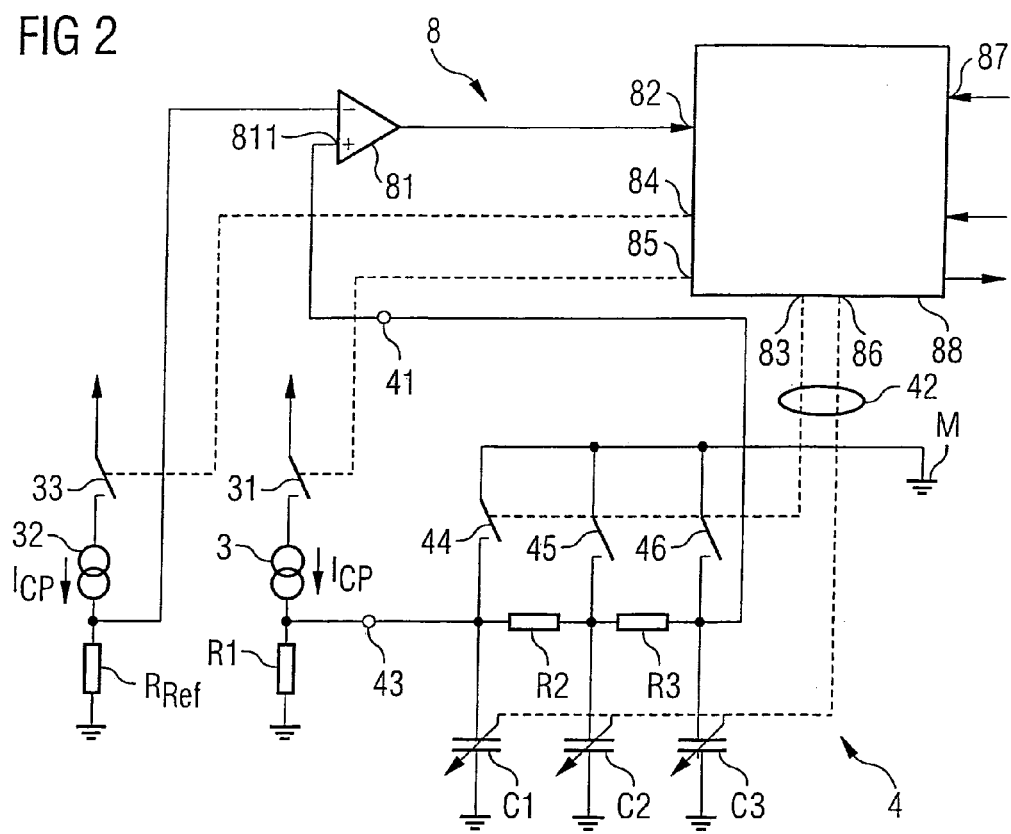
FIG. 2 is a schematic diagram illustrating a detail from the exemplary embodiment shown in FIG. 1.

A more detailed exemplary embodiment of the loop filter 4 with the trimming circuit 8 is shown in FIG. 2. Components which have the same action or operation bear the same reference symbols.

The loop filter 4 based on the exemplary embodiment in FIG. 2 has its input 43 connected between a tap node in the charge pump circuit 3 and a resistor R1. The second connection of the resistor R1 is routed to the ground potential. The charge pump circuit 3 produces a charge pump current $I_{CP}$ which is transformed into the actuating signal by the resistor R1 operating as a current/voltage converter. In addition, the connection 43 is connected to the output 41 of the loop filter 4 via the resistors R2 and R3.

Provided between the connection 43 and the resistor R2 is a tap which is routed to a connection of a tunable capacitor C1 and to a switch 44. A further node is formed between the resistors R2 and R3 of the loop filter 4 and is routed to a second tunable capacitor C2 and to a second switch 45. Finally, one connection of a third tunable capacitor C3 and also of a third switch 46 is connected to the output 41 of the loop filter 4.

The two resistors R2 and R3 and also the tunable capacitors C1 to C3 form a third-order low-pass filter. In addition, each capacitor forms an RC element having a low-pass characteristic with a resistor. The respective other connections of the capacitors C1 to C3 are connected to the ground potential. In the same way, the other connections of the switches 44, 45 and 46 are also connected to the ground potential M. The tuning inputs of the capacitors C1, C2 and C3 are connected to the setting input 42 of the loop filter 4. Similarly, the switches 44 to 46 are also actuated by signals which are supplied to the setting input 42.

The setting input 42 of the loop filter 4 is connected to the outputs 83 and 86 of a circuit logic unit 88. Further inputs 87 of this circuit logic unit can be supplied with external parameters which set further functions of the circuit logic unit 88 for the trimming operation. By way of example, these are additional correction factors for the measuring time or else manual control of the switches for the tunable capacitors or the two charge pumps. These additionally transferred parameters can be used to verify or to alter the trimming parameters. In addition, the circuit logic unit is supplied with a clock signal from which the measuring time is derived, for example.

The circuit logic unit 88 also contains the outputs 84 and 85, which are connected to the switches 33 and 31. The switches 33 and 31 control and activate the charge pumps 3 and 32. The charge pump 32 forms a reference charge pump and is needed for generating a reference voltage signal during the trimming operation. To this end, the output of the reference charge pump 32 is connected to a reference resistor $R_{ref}$. A tap between the output of the reference charge pump 32 and the resistor $R_{ref}$ is routed to the inverting input "−" of a comparator 81. The noninverting input "+" forms a signal input 811, which is connected to the output 41 of the loop filter 4. The output of the comparator 81 is routed to a signal input 82 of the logic circuit 88.

To trim the loop filter 4, the time period required by a charging operation in the charge stores of the loop filter with a charging current $I_{CP}$ is now determined. From this, a control signal 86 for the capacitors in the capacitances C1 to C3 is generated to alter the filter transfer characteristic.

If the filter transfer characteristic is in line with the stipulations, the trimming is terminated and component-related variations are compensated for.

To this end, in a first step the switch 7 shown in FIG. 1 is closed, so that the output 61 is connected to the input 811. This operating state is shown in the exemplary embodiment in FIG. 2. In a first step, all of the capacitors C1 to C3 are discharged in one example. To this end, the capacitors contained in the individual tunable capacitors are connected and the switches 44 to 46 are closed. After some time, the switches are opened again and the tunable capacitors C1 to C3 are set to a capacitance value. This is, in one example, a value which can be achieved by connecting the respective largest single capacitor in the tunable capacitors. All of the tunable capacitors are tuned and discharged in the present example. The loop filter 4 now has a particular transfer characteristic which is dependent on the total capacitance of the tunable capacitors, inter alia.

Next, the logic unit 88 closes the switches 33 and 31 for the reference charge pump 32 and the charge pump 3. The inverting input "−" of the comparator 81 now has a reference voltage signal applied to it which is obtained from the reference current $I_{CP}$ from the reference charge pump 32 and the reference resistors $R_{ref}$.

The charging current $I_{CP}$ coming from the charge pump 3 now charges the tunable capacitors C1 and C2. This increases the voltage drop across the capacitors C1 and C2, which results in a voltage rise at the input 811 and at the noninverting input "+" of the comparator 81.

After a time prescribed by the logic unit 88, the output signal from the comparator 81 is ascertained by the logic unit 88. Depending on this result, further capacitors can now be connected or can be disconnected from the loop filter, or the capacitance of the capacitors C1 and C2 can be tuned and altered. To do this, all of the tunable capacitors are discharged again beforehand.

If the signal which is output by the comparator 81 represents a logic 1, for example, that is to say that the voltage applied to the noninverting input "+" is higher than the reference voltage at the inverting input "−", then this means that the filter charging time is too fast. The time constant of the loop filter is accordingly too short or the total capacitance of the loop filter is too low. This comes from the consideration that with a constant charge flowing the voltage drop across the tunable capacitors C1 to C3 is dependent only on the capacitance of the capacitors.

Hence, if a positive signal is applied to the input 82 after the period prescribed by the logic circuit 88, the logic circuit 88 needs to increase the total capacitance. This is done by connecting further capacitors or generally by increasing the capacitance.

If the filter charging time is conversely too slow, this means that the total capacitance of the loop filter is too high. The output signal from the comparator 81 is then a logic 0. In such a case, the logic circuit 88 therefore uses an appropriate control signal at the output 86 to isolate some of the capacitors in the tunable capacitances C1 to C3 from the rest of the loop filter and thus reduces the total capacitance.

The operation can be repeated in order to obtain better trimming. To do this, it is necessary to discharge the capacitors C1 to C3 so that the charging time of the loop filter can be ascertained again. The logic circuit 88 uses a control signal at the output 83 to close the switches 44, 45 and 46. The capacitors C1 to C3 are discharged again. At the same time, the switch 31 is naturally also open, which means that the charge pump does not produce a charging current and hence a short circuit. When the capacitors have been discharged, the switches 44 to 46 are opened again and the charging time of the loop filter with the changed filter characteristic is ascertained again.

This operation can be repeated several times before, for example, the logic circuit 88 detects a change in the logic state of the signal applied to the input 82 for the first time. Such a change is synonymous with a change from too fast a filter charging time to too slow a filter charging time or from too slow a filter charging time to too fast a filter charging time. The error which then still exists is in the order of magnitude of the last connected or disconnected capacitance.

Figure 3:
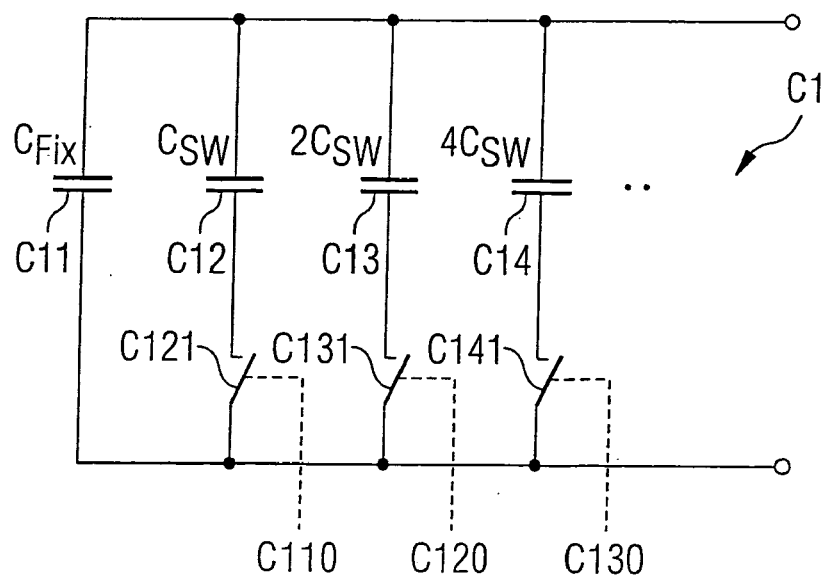
FIG. 3 is a schematic diagram illustrating an exemplary embodiment of a tunable capacitor.

This error can be minimized by means of appropriate binary weighting of the capacitors C1 to C3. An exemplary embodiment of one of these capacitors C1 to C3 with variable capacitance is shown in FIG. 3. In this figure, a number of capacitors C11 to C14 are connected in parallel. The capacitor C11 is chosen as a fixed capacitance $C_{fix}$, while the capacitors C12 to C14 are arranged so that they can be switched by switches C121 to C141 in parallel with the capacitor C11. The switches C121 to C141 are, in one example, in the form of transmission gates or, in another example, in the form of field effect transistors.

The capacitance of the capacitors C12 to C14 is respectively twice the previous capacitance. The individual capacitors are thus subjected to binary weighting, with each capacitor C12 to C14 being provided by a number of identical basic capacitors. This minimizes any discrepancy among the individual capacitors C12 to C14. At the same time, the refinement of binary weighting allows particularly simple and very accurate resolution for determining the charging time and hence the filter characteristic of the loop filter. The switches C121 to C141 are actuated by corresponding signals C110 to C130 which are applied to the setting input 42 of the loop filter 4.

Naturally, an alternative refinement of a variable capacitance is also conceivable and such alternatives are contemplated as falling within the scope of the present invention. Thus, by way of example, continuously variable capacitances may be used, with the actuating signal being prescribed by a suitable tuning voltage. Continuously variable capacitances can be implemented by varactor diodes, for example.

The time constant and hence the charging time and the filter characteristic of the loop filter 4 may likewise be changed by changing the values of the resistors R2 and R3. The resistors would then need to be in the form of potentiometers or else in the form of a selectable discrete-value resistor network.

As an alternative to the embodiment presented above, of repeatedly determining the filter charging time several times, it is likewise possible in accordance with the invention to infer the capacitance which still needs to be connected or disconnected from the difference between the voltage which is output by the loop filter and the reference voltage. Thus, not just one capacitor is connected or disconnected on the basis of the voltage difference, but rather a plurality thereof. In this case, calculations are performed to determine how large a change of capacitance would need to be in order to make the voltage difference as small as possible. This change of capacitance is made after the charging time has been determined for the first time. This achieves a much faster trimming speed, since the number of trimming and determination operations is reduced.

Figure 4:
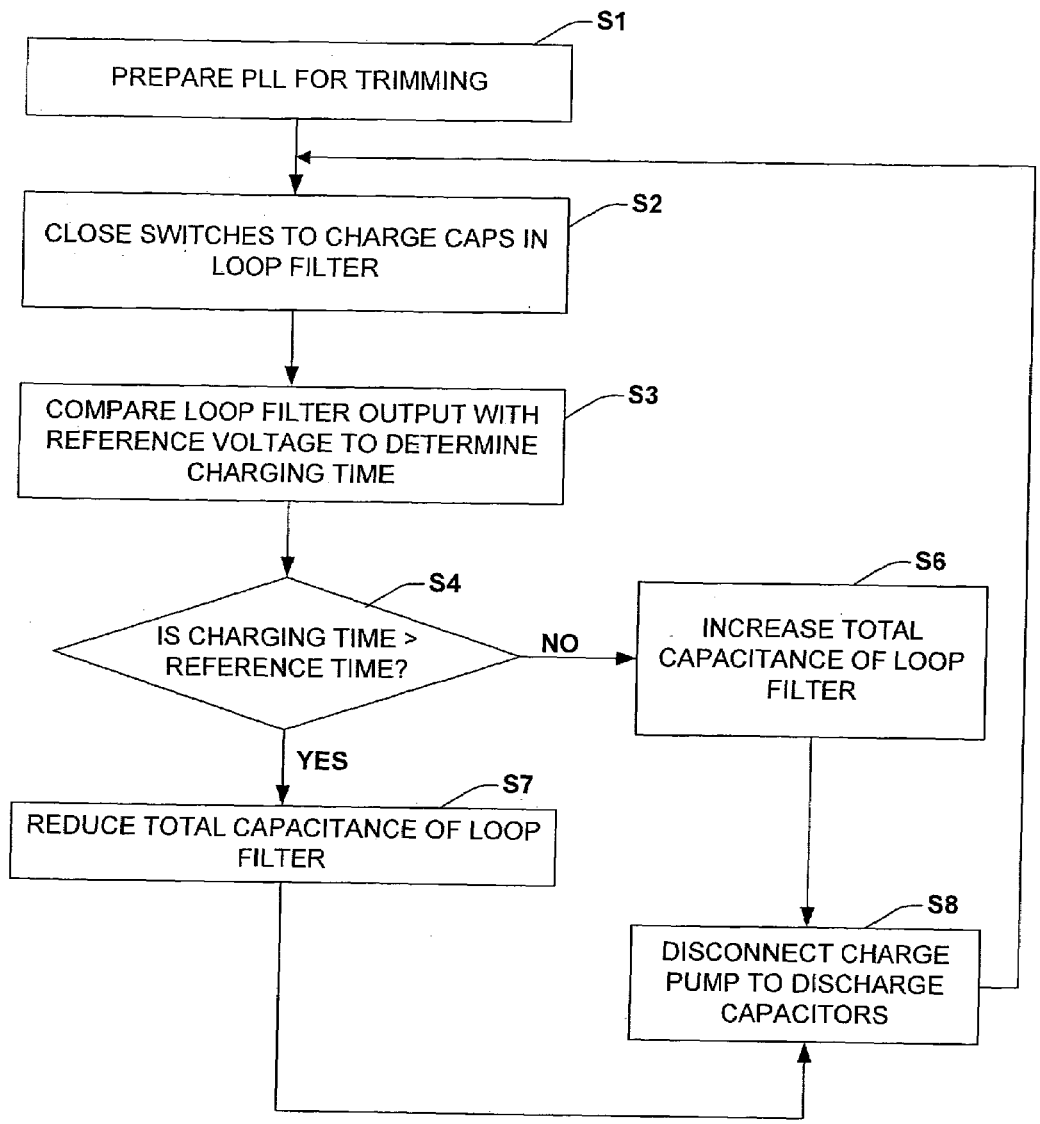
FIG. 4 is a flow chart diagram illustrating an exemplary embodiment of the method based on the invention.

FIG. 4 shows an exemplary embodiment of the inventive method. While the method and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

At S1, the inventive phase locked loop is prepared for the trimming. To this end, inter alia, the output 41 is connected to the input 811 of the trimming circuit 8. It is likewise expedient to provide for initialization through appropriate connection and disconnection of the capacitors in the loop filter 4. In addition, all of the capacitors are discharged.

At S2, the switches 31 and 33 shown in the exemplary embodiment in FIG. 2 are closed and the capacitors in the loop filter are charged. Charging is effected by supplying a charging current which is provided by the charge pump 3. The charge pump 3, which may likewise have error-tolerant components, is thus used directly for ascertaining the charging time and hence the filter characteristic of the loop filter.

At S3, the voltage drop at the output of the loop filter 4 is compared with a reference voltage. The voltage drop at the output of the loop filter 4 is dependent on the total capacitance of the capacitors within the loop filter 4 and on the supplied charge during the charging operation. If the voltage drop at the output of the loop filter 4 exceeds a limit value prescribed by the reference voltage, a signal is output. This makes it possible to ascertain the time period which has elapsed since the start of the charging operation. This time period is compared with a reference time period. If the time period is longer than the reference time period, this means that the total capacitance of the loop filter is too high. The filter charging time is thus too long.

The total capacitance of the loop filter 4 is then reduced at S7. This can be done by disconnecting at least one capacitor, for example. At S8, the charge pump 3 is disconnected or isolated from the input of the loop filter, and the capacitors are discharged again. The method can now be repeated with a low capacitance for the loop filter at S2.

If, by contrast, the comparison between the ascertained time and the reference time at S4 shows that the ascertained time is shorter than the reference time, then the total capacitance of the loop filter is too low and the filter charging time is too fast. Consequently the total capacitance of the loop filter is increased at S6, for example by connecting a further capacitor. The capacitors are discharged again at S8 in this case too and the method is repeated at S2.

As an alternative to this embodiment, in which the charging time is ascertained and compared with a reference time, the voltage drop at the output of the loop filter can be compared at S3, with the reference voltage after a prescribed time period. Hence, a particular time is prescribed at S3 and it is determined whether the voltage drop at the output of the loop filter is larger or smaller than the reference voltage after the prescribed period. If the reference voltage is smaller than the voltage drop at the output at S4, the method is continued at S6 by increasing the capacitance.

If, by contrast, the reference voltage is larger than the voltage drop at the output of the loop filter, this means that the total capacitance is too high for the loop filter and hence that the filter charging time is too slow, and the method is continued at S7 by reducing the capacitance.

The method can be repeated until an optimum has been achieved. This is obtained by virtue of a different result from the comparison at S4, for example. Alternatively, the magnitude of the difference may be ascertained and an amount of capacitance change can be effectuated in response thereto, thereby avoiding an iterative process. Finally, the loop filter 4 is then connected to the setting input of the voltage-controlled oscillator 6 again with these settings.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A phase locked loop, comprising:
   a voltage-controlled oscillator comprising a setting input and with a signal output that forms a control loop output from the phase locked loop;
   a phase comparator comprising a reference input configured to receive a reference signal, a feedback input connected to the signal output of the voltage-controlled oscillator via a frequency divider to form a feedback path, and an output, and configured to output an actuating signal at the output thereof based on a comparison of a feedback path signal and the reference signal;
   a charge pump configured to output a control voltage derived from the actuating signal, the charge pump comprising a control input connected to the output of the phase comparator;
   a loop filter comprising an output coupled to the setting input of the voltage-controlled oscillator and an input configured to receive the control voltage from the charge pump, and comprising a first charge store and at least one tunable element configured to selectively alter a filter characteristic of the loop filter; and
   a trimming circuit operably coupled to the loop filter, and configured to compare a time period for at least one charging operation in the first charge store of the loop filter with a reference time period, and configured to selectively tune the at least one tunable element in order to alter the filter characteristic of the loop filter based on the comparison.

2. The phase locked loop of claim 1, wherein the output of the loop filter is coupled to an input of the trimming circuit, and the trimming circuit comprises a comparison circuit configured to compare a voltage applied to the input with a reference voltage.

3. The phase locked loop of claim 2, wherein the trimming circuit comprises a switchable reference charge pump configured to output a reference voltage which is coupled to a first input of the comparison circuit, and wherein a second input of the comparison circuit is coupled to the output of the loop filter.

4. The phase locked loop of claim 2, wherein the comparison circuit comprises a comparator circuit.

5. The phase locked loop of claim 1, wherein the at least one tunable element of the loop filter comprises at least one second charge store arranged in parallel with the first charge store, and comprising a capacitance that is tunable by the trimming circuit.

6. The phase locked loop of claim 1, wherein the tunable element of the loop filter comprises an RC element with a tunable resistor and a second charge store.

7. The phase locked loop of claim 1, wherein the loop filter comprises a tuning input configured to receive a tuning signal for tuning the tunable element, wherein the tuning input is connected to a tuning output of the trimming circuit.

8. The phase locked loop of claim 5, wherein the at least one tunable second charge store comprises at least two parallel-connected charge stores coupled to one another via a respective switch arranged in series with the charge stores, wherein a switching state of the switches dictates the capacitance of the tunable second charge store.

9. The phase locked loop of claim 8, wherein the capacitances of the at least two charge stores arranged in parallel differ from one another by a factor of 2.

10. The phase locked loop of claim 1, the loop filter further comprising a second switch circuit controlled by the trimming circuit, and configured to discharge the first charge store or the at least one tunable element, or both.

11. The phase locked loop of claim 1, wherein the first charge store comprises a tunable-capacitance element coupled to the trimming circuit.

12. The phase locked loop of claim 1, wherein the output of the loop filter is selectively coupled to the input of the trimming circuit via a switching apparatus.

13. The phase locked loop of claim 1, further comprising a switching apparatus coupled between the setting input of the voltage-controlled oscillator and the output of the loop filter, and configured to couple the output of the loop filter to the setting input of the oscillator in a first state, and to couple the output of the loop filter to the input of the trimming circuit in a second state.

14. A phase locked loop, comprising:
  a voltage-controlled oscillator comprising a setting input and with a signal output that forms a control loop output from the phase locked loop;
  a phase comparator comprising a reference input configured to receive a reference signal, a feedback input connected to the signal output of the voltage-controlled oscillator via a frequency divider to form a feedback path, and an output, and configured to output an actuating signal at the output thereof based on a comparison of a feedback path signal and the reference signal;
  a charge pump configured to output a control voltage derived from the actuating signal, the charge pump comprising a control input connected to the output of the phase comparator;
  a loop filter comprising an output coupled to the setting input of the voltage-controlled oscillator and an input configured to receive the control voltage from the charge pump, and comprising a first charge store and at least one tunable element configured to selectively alter a filter characteristic of the loop filter; and
  a means for determining an initial loop filter characteristic of the loop filter and comparing the initial filter characteristic to a reference characteristic, and altering the initial filter characteristic to an adjusted filter characteristic based on the comparison.

15. The method of claim 14, wherein the determining means comprises a means for determining a charging time for the first charge store of the loop filter, and for comparing the charging time with a reference time period, the means being coupled to the at least one tunable element in order to alter the filter characteristic of the loop filter based on the comparison.

16. The phase locked loop of claim 14, wherein an output of the loop filter is coupled to an input of the determination means, and the means comprises a comparison circuit configured to compare a voltage applied to the input with a reference voltage.

17. A method for trimming a loop filter in a phase locked loop, comprising:
  providing a loop filter comprising at least one charge store and having an initial filter characteristic;
  supplying a charging current to the loop filter;
  determining a time period required to charge the at least one charge store; and
  altering the filter characteristic of the loop filter based on the determined time period.

18. The method of claim 17, wherein determining the time period comprises:
  generating a reference voltage;
  comparing a voltage at the output of the loop filter that is a function of the charging of the at least one charge store with the reference voltage;
  generating a signal when the loop filter output voltage reaches the reference voltage;
  ascertaining an elapsed time since the start of supply of the charging current up to detection of the generated signal; and
  comparing the ascertained time to the reference time.

19. The method of claim 17, wherein determining the time period comprises:
  generating a reference voltage;
  comparing a voltage at the output of the loop filter that is a function of the charging of the at least one charge store with the reference voltage; and
  ascertaining the comparison result after a predetermined time.

20. The method of claim 17, wherein altering the filter characteristic comprises altering a time constant for the charging of the at least one charge store by connecting or disconnecting charge stores associated with the loop filter to alter the charging time, or altering a load associated with the loop filter that prescribes the charging current.

21. The method of claim 17, wherein altering the filter characteristic comprises:
  increasing a time constant for the charging if the charging time is shorter than the reference time or the voltage which is output at the output of the loop filter is lower than the reference voltage; or
  reducing the time constant for the charging if the charging time is longer than the reference time or the voltage which is output at the output of the loop filter is higher than the reference voltage.

22. The method of claim 17, further comprising:
  discharging the at least one charge store after the time period has been determined; and
  repeating the method with the altered filter characteristic.

* * * * *